United States Patent [19]

Cline

[11] Patent Number: 5,659,629
[45] Date of Patent: Aug. 19, 1997

[54] VISUALIZATION OF A MULTI-DIMENSIONAL DATA SET ACQUIRED WITH A SURFACE RECEIVE COIL

[75] Inventor: Harvey Ellis Cline, Schenectady, N.Y.

[73] Assignee: General Electric Company, Schenectady, N.Y.

[21] Appl. No.: 419,072

[22] Filed: Apr. 7, 1995

[51] Int. Cl.$^6$ ........................................... G06K 9/00
[52] U.S. Cl. ........................................... 382/131; 395/125
[58] Field of Search ........................................... 382/128, 130, 382/131; 324/307, 309; 364/413.13, 413.14; 395/125, 119

[56] References Cited

U.S. PATENT DOCUMENTS

| | | | |
|---|---|---|---|
| 4,719,585 | 1/1988 | Cline et al. | 395/124 |
| 4,812,753 | 3/1989 | Fuderer et al. | 324/307 |
| 4,945,478 | 7/1990 | Merickel et al. | 382/131 |
| 4,985,834 | 1/1991 | Cline et al. | 364/413.22 |
| 5,101,638 | 4/1992 | White | 62/51.1 |
| 5,187,658 | 2/1993 | Cline et al. | 364/413.13 |
| 5,208,533 | 5/1993 | Le Roux | 324/307 |
| 5,208,534 | 5/1993 | Okamoto et al. | 324/309 |
| 5,432,447 | 7/1995 | Song | 324/309 |
| 5,515,855 | 5/1996 | Meyer et al. | 128/653.5 |
| 5,557,247 | 9/1996 | Vaughn, Jr. | 333/219 |

OTHER PUBLICATIONS

"Respiratory Blur in 3D Coronary MR Imaging" by Y. Wang, T.M. Grist, F.R. Korosec, P.S. Christy, M.T. Alley, J.A. Polzin, C.A. Mistretta—MRM–33:541–548 (1995).
U.S. Patent Application (Atty. Docket No. RD–22,204), Ser. No. 08/121,628, Filed Sep. 16, 1993 Entitled "Gradient Image Segmentation Method" by Cline, Lorensen.

*Primary Examiner*—Joseph Mancuso
*Assistant Examiner*—Jayanti K. Patel
*Attorney, Agent, or Firm*—Lawrence P. Zale; Marvin Snyder

[57] ABSTRACT

A multi-dimensional data set acquired by non-intrusive means with the use of a surface coil of internal structures of internal structures of a subject. The data set is adjusted for the differential sensitivity of the surface coil with respect to distance from the coil and angle in relation to the coil. The adjusted data set then is searched for abrupt changes in value in the data set indicating surfaces. The surfaces then may be manipulated, shaded, color coded and displayed. This is particularly useful in when employed on a data set which images blood for providing surface images of coronary arteries of the subject for non-invasive detection of occlusion and stenosis.

8 Claims, 4 Drawing Sheets

VISUALIZATION OF A MULTI-DIMENSIONAL DATA SET ACQUIRED WITH A SURFACE RECEIVE COIL

CROSS REFERENCE TO RELATED APPLICATIONS

This is related to copending U.S. patent application Ser. No. 08/121,628 filed Sep. 16, 1993 "Gradient Image Segmentation Method" by Cline, Lorensen, assigned to the present assignee and hereby incorporated by reference.

BACKGROUND OF THE INVENTION

1. Field of the Invention

This invention relates to systems for displaying surfaces of internal structures within solid bodies, and, more particularly, to systems for displaying surfaces of data acquired with a surface coil.

2. Description of Related Art

It is important to non-invasively visualize internal structures of a subject for various reasons. If the subject is a living person, it is necessary to view internal structures to make a diagnosis. One very important use is to visualize arteries and veins of the heart of a subject to determine if they are occluded. This is important in predicting cardiac arrest, and determining the health of the subject's heart. In the past, exploratory surgery, and catheter procedures have been used to determine narrowing, stenosis, and occlusion of vessels. These are very involved, painful and risky.

Multi-dimensional arrays of data representing one or more physical properties of a subject at regular grid positions within the interior of solid bodies have been acquired using magnetic resonance (MR) imaging systems. MR imaging employing external coil has been used to determine stenosis and occlusion. An external coil is typically one which encompasses the entire subject, or the entire portion of the subject being imaged. This imaging method produces planar, or slice, images of an imaging plane oriented through the heart. This is not nearly as invasive and much less risky than other procedures. A plane is selected which passes lengthwise through a coronary vessel. This produces a good image of the vessel which is in the imaging plane, however, many images of different imaging planes may be required to produce image the entire vessel. The images are discontinuous since they would be the composite of many different images taken at different imaging planes. It becomes difficult for the operator to mentally construct a three-dimensional shape and orientation of the vessel from the images. Also, there is no guarantee that no portion of the vessel has been omitted.

Three-dimensional MR image data sets have also been constructed using a external coil, however their large field of view and lack of detail do not allow accurate diagnosis of cardiac vessels. The data sets have been used to generate visual images of the interior structures within the subject. Surfaces of structures within the data set may then identified and shaded as described in U.S. Pat. No. 4,719,585, granted Jan. 12, 1988 by Cline et al.; segmented and color coded as described in U.S. Pat. No. 5,187,658 issued Feb. 16, 1993 "System And Method For Segmenting Internal Structures Contained Within The Interior Region Of A Solid Object" by Cline, Lorensen; then displayed to an operator. Both of the patents referenced here are assigned to the present assignee and hereby incorporated by reference. The visual images thus produced can be used for medical purposes such as diagnostics or for the planning of surgical procedures.

MR data sets have also been acquired employing a surface coil, instead of an external coil, to localize the MR image field of view to the heart to provide increased detail of cardiac vessels. A surface coil is typically a planar coil place on the surface of the subject at approximately the location where an image is desired. Surface coils receive MR response signals from a localized region of the subject, with its sensitivity dropping off away from the surface coil and to each side. Even though the surface coil provides better localization than external coils, the surface coil exhibit a different sensitivity profile which causes distortion, providing images which may not be used for cardiac vessel diagnosis.

Currently, there is need for a non-invasive method of providing detailed images of structures for diagnostic purposes.

SUMMARY OF THE INVENTION

An image data set is acquired by an imaging device employing a surface coil. The data set is restricted to desired structures, then adjusted to correct for intensity variation due to the surface coil's sensitivity pattern with respect to distance from the surface coil, and angle with respect to coil. This adjusted data set is then analyzed to determine changes in intensity greater than predetermined thresholds to determine surfaces and the orientation of the surface identified by a normal vector. The surfaces may then be displayed with shading, or coloring pertaining to the orientation of normal vector. This results in derailed surface images.

If the data set employed images blood with greater intensity relative to other tissues, and the surface coil is positioned to image a subject's heart, the images produced provide accurate perspective surface images of cardiac vessels which allows non-invasive diagnosis of occlusion and stenosis.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

To facilitate reader understanding, identical reference numerals are used to designate elements common to the figures.

DETAILED DESCRIPTION OF THE INVENTION

Figure 1:
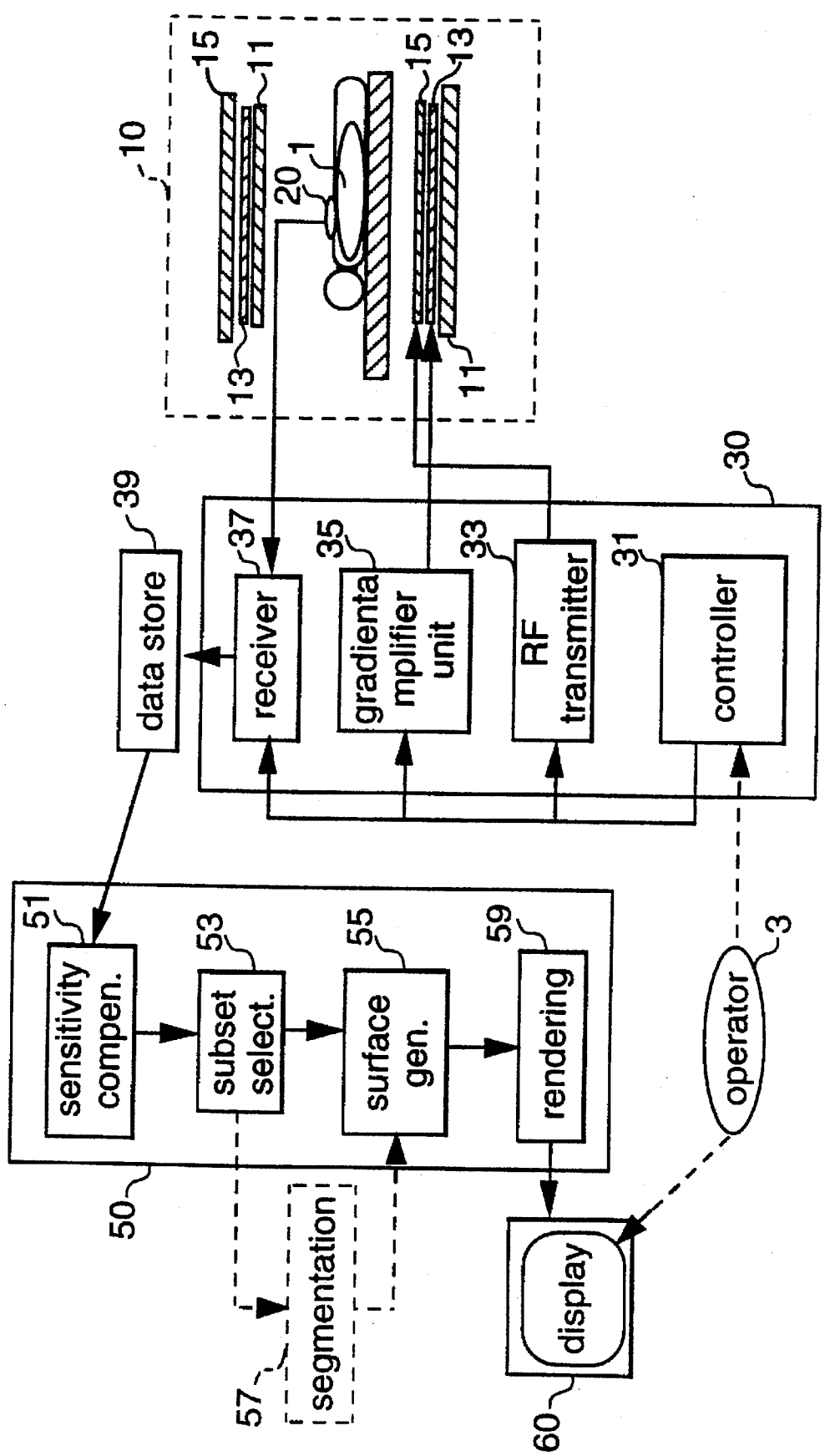
FIG. 1 is a block diagram of surface visualization system in accordance with the present invention.

A block diagram of the visualization system according to the present invention is shown in FIG. 1. In the preferred embodiment, a magnetic resonance (MR) imaging system is employed for medical imaging. A subject 1 is positioned within a main magnet 11 of the subject interface 10 of an MR imaging system. Magnet 11, shown in cross-section, provides a static, spatially homogeneous magnetic field over an imaging volume inside the magnet.

A gradient amplifier 35 of the MR Imaging electronics 30 provides power to a plurality of gradient coil sets 13, also shown in cross section, located within magnet 11, each producing a magnetic field gradient in a specified direction.

An RF transmitter 33, supplies the necessary power to an RF coil 15 to nutate nuclear spins within subject 1 in the imaging volume.

In FIG. 1, an operator 3 interacts with a controller 31 to specify the region of subject 1 to be imaged. Controller 31 controls the timing and activation of gradient amplifier 35 and RF transmitter 33 to produce magnetic field gradients and RF radiation which cause an MR response signal to be emitted by tissue of subject 1.

A surface coil 20 senses the emitted MR response signal from subject 1, and provides this signal to a receiver 37 processes the sensed signal according to known conventional MR reconstruction techniques into a multi-dimensional array of image data values, being a data set. This data set is stored in data store 39 for further processing.

The data set may be a three-dimensional data set being a plurality of two dimensional data slices, or may be directly acquired three-dimensional data. The data set may also be acquired at a different time or place and provided to the remainder of the system for visualization. The data set is only required to be collected from a surface coil, and may be used on data acquired from other data acquisition devices which employ a surface coil, such as a biomagnetism imaging device which acquires and creates images from electric and magnetic fields produced by a subject.

Sensitivity Compensation

Figure 2:
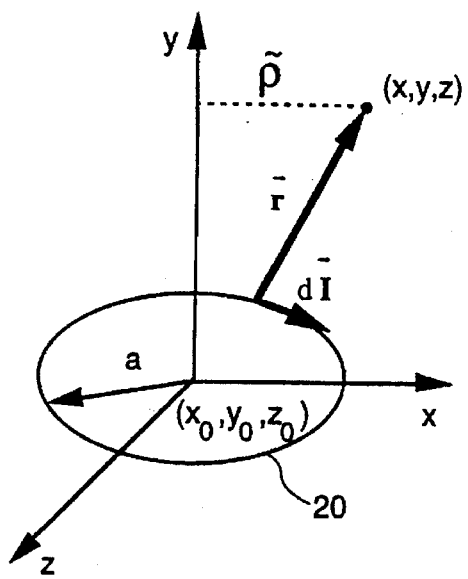
FIG. 2 is a diagram of the surface coil of FIG. 1 used in describing adjustment of data for the coil sensitivity profile.

In FIG. 2, surface coil 20 of FIG. 1 is shown in an enlarged view. An incremental current-carrying element $d\vec{l}$ of surface coil 20 is shown receiving an signal from a an incremental tissue element within subject 1 located at (x,y,z) relative to the center of surface coil 20. According to the Bivot Savot rule, if $\vec{r}$ is the position vector from point (x,y,z) to the current element $d\vec{l}$, and |r| is the scalar magnitude of position vector $\vec{r}$, the gain of the signal received by surface coil 20 is:

$$|B| = \oint \frac{d\vec{l} \times \vec{r}}{|r|^3} \, dl. \tag{1}$$

For a circular coil of radius a, a discrete implementation of Eq. (1) becomes:

$$|B| = \left| \sum_\theta \frac{(a^2 + \rho^2 \cos\theta - 2a\rho\cos\theta + z^2)^{1/2}}{(a^2 + \rho^2 - 2a\rho\cos\theta + z^2)^{3/2}} \right|. \tag{2}$$

where ρ is radial distance away from the axis of the coil, and z is the distance along the axis of the coil. It can seen that as the as the relative angle between surface coil 20 and location (x,y,z) of the tissue element emitting a signal increases (radial distance r away from the axis of surface coil 20 increases) the intensity of the signal received decreases. Also, the intensity of the signal received decreases as the distance along the axis of the coil increases. By adjusting the data set for this change in sensitivity of surface coil 20, the data set is normalized.

By approximating the surface coil centered at $(x_o, y_o, z_o)$ by a polygon having a 2n segments, the equation in Cartesian coordinates would be:

$$|B| = \left| \sum_{i=0}^{n-1} \frac{\left\{ a^2 + \tilde{z}^2 - 2a\tilde{\rho}\cos\left(\frac{\pi i}{n+1}\right) + \tilde{\rho}^2\cos^2\left(\frac{\pi i}{n+1}\right) \right\}}{\left\{ a^2 + \tilde{z}^2 + \tilde{\rho}^2 - 2a\tilde{\rho}\cos\left(\frac{\pi i}{n+1}\right) \right\}^{3/2}} \right|^{1/2}$$

where $\tilde{x}, \tilde{y}, \tilde{z}$ are the Cartesian coordinates of x,y,z with respect to the center of surface coil 20, respectively, $\rho = \sqrt{(x-x_o)^2 + (y-y_o)^2}$, and $\tilde{z} = z - z_o$.

The gain at the center of coil $(X_O, Y_O, Z_O)$ is:

$$|B_0| = \frac{n}{a^2}. \tag{4}$$

The gain at the center of coil $(X_O, Y_O, Z_O)$ for Eq. (2), in polar coordinates, would be:

$$|B_0| = \frac{\theta}{a^2} \tag{5}$$

By knowing the locations of the data values relative to surface coil 20, and the position and geometry of surface coil 20, the data values can be adjusted to normalize them by dividing each by the gain |B|, and multiplying by the gain $|B_O|$ at the center of the coil:

$$N(x,y,z) = \frac{|B_0|}{|B|} d(x,y,z). \tag{6}$$

where N(x,y,z) is the normalized, or adjusted data value for location (x,y,z) and d(x,y,z) is the original data value acquired for location (x,y,z).

In FIG. 1, image data set from data store 39 is provided to a modeling unit 50 which has several subsystems performing distinct functions.

A sensitivity compensation device 51 corrects the data set for the sensitivity of the surface coil by reading in the data set and normalizing each data value as described in Eqs. (1)–(6). This corrects for the sensitivity of surface coil 20 for different distances from the surface coil and its angles relative to the surface coil. This provides an adjusted data set which is provided to subset selection device 53.

Figure 3:
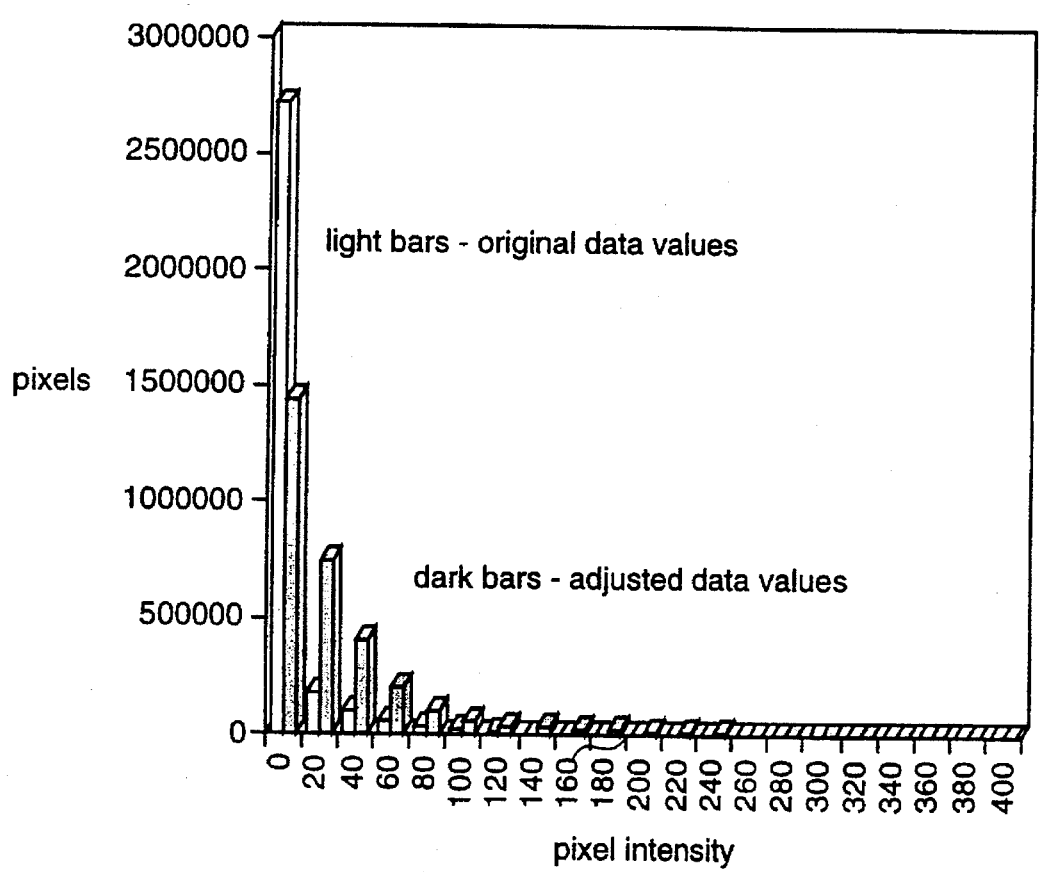
FIG. 3 is a histogram of pixel intensity vs. the number of pixels for the original image data set and a normalized data set derived from the original data set.

FIG. 3 shows a histogram of pixel intensity vs. number of pixels for the original image data set and a normalized data set derived from the original data set created by sensitivity compensation device 51.

Subset selection device 53 interacts with the operator to allow operator to select a subset of the adjusted data set from sensitivity compensation device 51 which encompasses the region of tissue desired to be visualized.

Subset selection device 53 interacts with operator 3 to allow operator 3 to select a volume of the data set. Surface generation device 55, rendering device 59, and display device 60 provide a surface model display to operator 3 of the selected volume, as described in detail below.

Subset selection device 53 also displays a histogram of pixel intensity vs. number of pixels for the selected data volume. Operator 3 visually determines if there is a grouping of intensity values in the distribution. If there is no grouping, or the grouping is not as distinct as desired, operator 3 may select a different volume of the data set. Another histogram is calculated and displayed to operator 3. This is repeated until a desired volume is selected.

Figure 4:
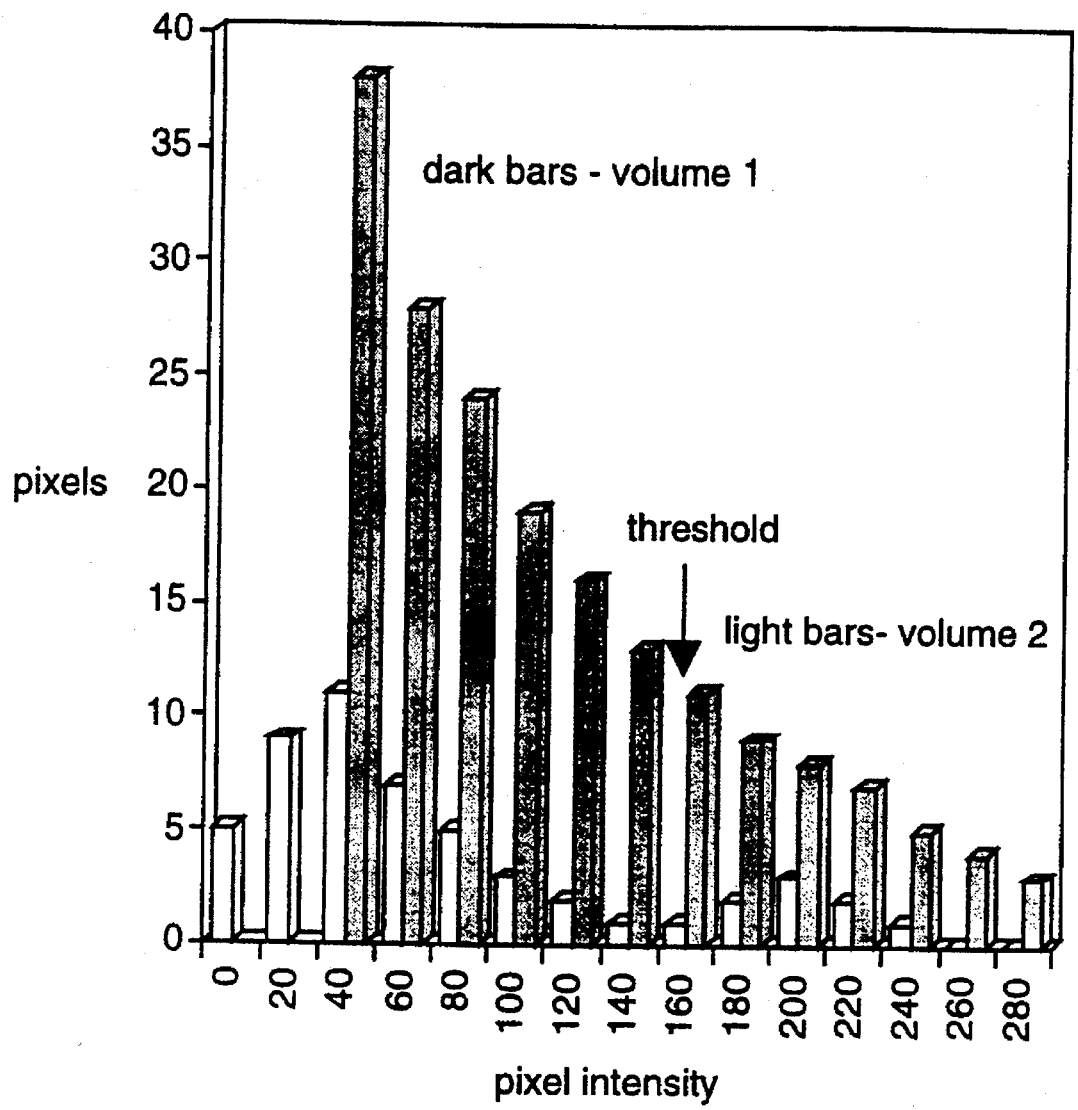
FIG. 4 is a histogram of pixel intensity vs. the number of pixels for a first and second volume of the adjusted image data set.

FIG. 4 is a histogram of pixel intensity vs. the number of pixels for a first volume, volume 1, shown as dark bars of the adjusted image data set from sensitivity compensation device 51; and for a second volume, volume 2 shown as light bars of the same adjusted data set. Values lower than 40 pixel intensity units of volume 1 are off the scale and not shown. Volume 2 was selected to encompass only the heart of subject 1 reducing the number of pixels having intensity less than 40. Low intensity values represent noise and muscle tissue (since the data set was acquired with increased sensitivity to blood, and the higher values pertain to blood which is what is desired to be imaged).

Volume 2 shows a bi-modal distribution of pixel intensities. A first mode from 0–150 represents muscle tissue and noise. A second mode are pixel intensities greater than 150 and represents blood. Since the vessels are intended to be imaged, a threshold of 150 is selected for this distribution to image blood surfaces.

Operator 3 visually selects modes and thresholds between modes. Surfaces are then identified based upon the selected thresholds.

Surface Generation

Surface generation device 55 works on the subset of adjusted data set to identify interfaces where the values jump significantly, or above a preselected threshold value. Surface generation device 55 produces a set of surface locations and a normal vector corresponding to each surface point.

The surface points and corresponding vectors can be calculated using the above-referenced "dividing cubes" method taught in H. E. Cline et at. U.S. Pat. No. 4,719,585. In this method, six of the neighboring data values to a selected data value are compared to determining if the selected data value is at an interface between two adjacent materials, such as the interface between skin and air. Different data values are sequentially selected and the comparisons repeated. The comparisons results in the location of data values on surfaces, and also a vector pointing in a direction normal to the surface at that location. Surface generator 55 may perform this method, or other conventional surface generation method, to result in a display list of the location of surface points and their corresponding normal vectors for each of the surfaces of interest.

Hidden surfaces can be removed with a depth buffer as taught in U.S. Pat. No. 4,985,834 issued Jan. 15, 1991 "System And Method Employing Pipelined Parallel Circuit Architecture For Displaying Surface Structures Of The Interior Region Of A Solid Object" by Cline et al., assigned to present assignee, and hereby incorporated by reference. Standard graphic processing software may also be employed to selectively cut, rotate and translate the surfaces to allow the user to view the surfaces in the most useful rendition. Such displays are typically used to plan surgery or to check on the progress of treatment.

Rendering

Optionally, an orientation selector 60 allows the user to select the viewing orientation while a display scale selector 59 allows the user to match the data to the available display pixel size, thus maximizing the display resolution.

These lists of surface points and normal vectors are supplied to a rendering device 59. Rendering device 59 interacts with operator 3 to allow operator 3 to select the surfaces and display viewing orientations, filed of view and other viewing parameters with which to view the surfaces and structures from surface generation unit 55. Rendering device 59 may then shade each point of the surface according to an angular difference between normal vector and a selected viewing angle. These surfaces may be viewed on a display device 110.

Due to the large magnetic fields employed by MR imaging, a display means near operator 3 may have to be a liquid crystal display. Also since there is substantial RF radiation, it should be enclosed in a suitable RF shielding to minimize RF interference.

Figure 5:
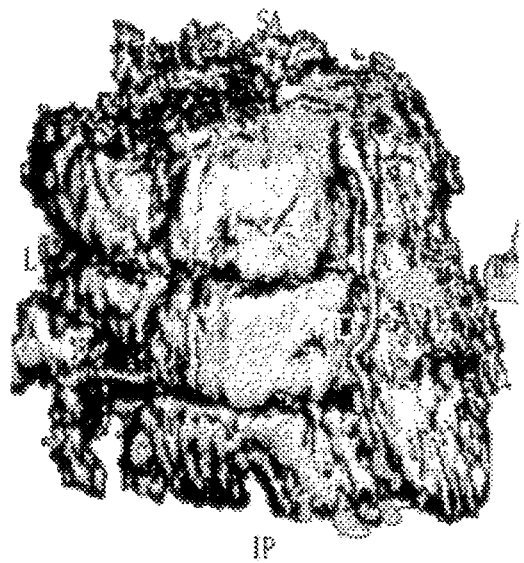
FIG. 5 is an image from a first viewpoint of a subject's heart and coronary vessels produced by the present invention from an actual MR data set.

FIG. 5 is an image created from actual MR data set which was adjusted by sensitivity compensation device 51. A subset of the adjusted data set and threshold were selected by subset selection device 53. The surfaces were determined with the threshold by surface generator 55. Rendering device 59 displayed the image as viewed from a first viewpoint on display 60 to result in FIG. 5. FIG. 5 shows the selected volume of the heart of subject 1 with the threshold for surface definition being selected to indicate interfaces between blood and other tissue. The left anterior descending (LAD) artery is clearly visible running vertically located ⅓ from the right of the image. The LAD provides the main blood supply to the left ventricle, and occlusion of this artery causes cardiac arrest, or a 'heart attack'. The initials on the figures represent: L—left, R—right, S—superior, I—inferior, A—anterior, and P—posterior.

Figure 6:
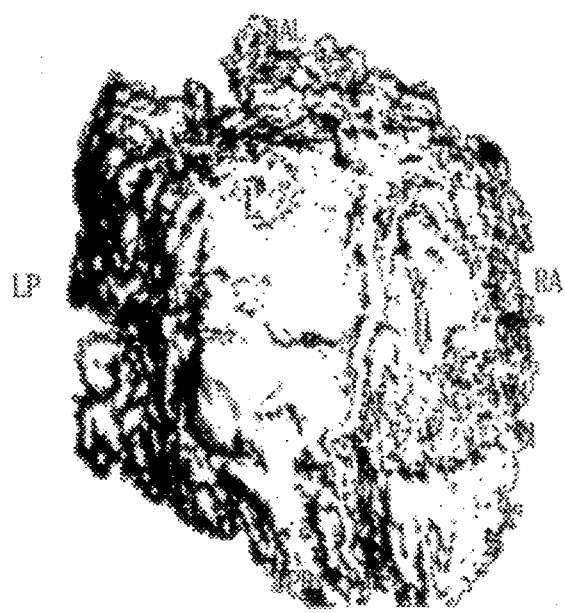
FIG. 6 is an image from a second viewpoint of a subject's heart and coronary vessels produced by the present invention from an actual MR data set.

FIG. 6 is a different view of the surfaces shown in FIG. 5 by selecting a different viewing angle and providing this viewpoint to rendering device 59. Since the surfaces may be manipulated, operator 3 may 'walk around' the image and examine it from different sides further facilitating diagnosis.

Segmentation

Optionally, a segmentation device 57 may work on the subset of the adjusted data set to determine data values and locations pertaining to the same tissue type, and determine connectivity between the same tissue types. A connected set of locations having the same tissue type is then treated as a solid structure, and may be color coded as such. One such method of segmentation is described in U.S. patent application Ser. No. 08/121,628, referenced in "Cross Reference to Related Applications". Once segmented, structures may be displayed, deleted or added to an image separately. It also allows three-dimensional color-coding and visualization of the structure without interference from other structures. This is very beneficial in surgical planning.

Another method of segmentation of internal structures is described in U.S. Pat. No. 5,187,658 issued Feb. 16, 1993 referenced in "Background of the Invention".

The result is a surface display of desired structures, which may be segmented for manipulation.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of visualizing internal physical structures of a subject from data values d(x,y,z) of a multi-dimensional data set with each data value acquired with a substantially circular surface coil at a location (x,y,z) relative to the surface coil comprising the steps of:

a) adjusting the multi-dimensional data set for surface coil sensitivity to create an adjusted data set N(x,y,z) according to:

$$N(x,y,z) = \frac{|B_0|}{|B|} d(x,y,z)$$

where $$|B_0| = \frac{\theta}{a^2}, |B| = \left| \sum_\theta \frac{(a^2 + \rho^2\cos\theta - 2a\rho\cos\theta + z^2)^{1/2}}{(a^2 + \rho^2 - 2a\rho\cos\theta + z^2)^{3/2}} \right|,$$

a is a radius of said surface coil, $\rho$ is radial distance away from a central axis of said surface coil, and z is a distance along the central axis of the coil:

b) calculating surfaces of the adjusted data set $N(x,y,z)$;

c) displaying the calculated surfaces on a display means.

2. The method of visualizing internal physical structures of claim 1 wherein the multi-dimensional data values $d(x,y,z)$ are adjusted according to the gain as determined by the Bivot Savot role.

3. The method of visualizing internal physical structures of claim 1 further comprising, after the step of adjusting, the steps of:

a) selecting a subset of the adjusted data set;

b) creating a histogram of pixel intensities of the selected subset of adjusted data set;

c) repeating steps "a"–"b" until the histogram indicates a grouping of pixel intensities;

d) select at least one threshold between the groupings; and e) employing the threshold to determine surfaces within the subset.

4. The method of visualizing internal physical structures of claim 1, wherein the multi-dimensional data set is acquired by nuclear magnetic resonance imaging.

5. The method of visualizing internal physical structures of claim 1, wherein the multi-dimensional data set is of a cardiac region of the subject which is specific to blood and the surfaces determined represent cardiac vessels of said subject.

6. The method of visualizing internal physical structures of claim 1 further comprising, after the step of adjusting, the step of segmenting the adjusted data set into structures each having the same tissue type.

7. The method of visualizing internal physical structures of claim 1 wherein the surfaces are determined by identifying similar adjacent data values to determine connected surfaces.

8. The method of visualizing internal physical structures of claim 1 further comprising, after the step of adjusting, the step of manipulating said surfaces by scaling and rotating the surfaces and selecting different viewing angles.

* * * * *